United States Patent [19]
Barton et al.

[11] 4,082,948
[45] Apr. 4, 1978

[54] GENERATOR MONITORING APPARATUS

[75] Inventors: Sterling C. Barton, Scotia; Chester C. Carson, Ballston Spa; Federico S. Echeverria, Scotia, all of N.Y.

[73] Assignee: General Electric Company, Schenectady, N.Y.

[21] Appl. No.: 783,772

[22] Filed: Apr. 1, 1977

[51] Int. Cl.² .................. G01N 31/00; G01T 1/18
[52] U.S. Cl. ............................ 250/304; 73/23.1; 250/380; 250/381
[58] Field of Search .............. 250/304, 380, 381; 73/23.1, 339 R

[56] References Cited
U.S. PATENT DOCUMENTS

| | | | |
|---|---|---|---|
| 3,185,845 | 5/1965 | Lively et al. | 250/381 X |
| 3,427,880 | 2/1969 | Grobel et al. | 73/339 R X |
| 3,940,618 | 2/1976 | Donguy | 250/304 |
| 3,968,371 | 7/1976 | Greendale | 250/304 |

*Primary Examiner*—Archie R. Borchelt

*Attorney, Agent, or Firm*—James W. Mitchell; John F. Ahern; Herbert E. Messenger

[57] ABSTRACT

Certain internal parts of a gas cooled dynamoelectric machine may be coated with selected materials which will decompose at elevated temperatures to give off sub-micron particles into the machine gas coolant called pyrolysates. The presence of such pyrolysates in the machine gas coolant is indicative of localized overheating within the dynamoelectric machine. A detector is known for sensing the occurrence of these pyrolysates and hence a monitoring system has been devised for giving an early warning of machine overheating. Occasionally, oil mist particles from the machine may become entrained in the machine gas coolant and cause a false overheating signal from the detector. A second detector has been devised which may be used in combination with the first detector to provide a redundant monitoring system which will provide immediate validation of the presence of pyrolysate particles and which monitoring system is testable on line.

6 Claims, 2 Drawing Figures

GENERATOR MONITORING APPARATUS

BACKGROUND OF THE INVENTION

This invention relates to gas cooled dynamoelectric machines; and, in particular, this invention relates to a monitoring system for the early detection of localized overheating which may occur in a gas cooled dynamoelectric machine.

Localized overheating may occur within the stator core of a large gas cooled dynamoelectric machine causing damage to the machine core which may lead to extensive machine outage and costly repairs. One of the ways in which localized overheating can occur is by damage to the surface of the stator teeth such that electrical contact can take place between core laminations leading to a flow of electrical current and resistance heating when the machine is under load. Localized overheating of this nature can generate enough heat to melt the core laminations. It is therefore highly desirable to provide an apparatus for the early detection of localized overheating in a dynamoelectric machine so that machine load can be reduced and corrective action taken prior to the occurrence of severe damage.

It has been found that at the onset of machine overheating there may become entrained in the machine gas coolant certain sub-micron particles called pyrolysates which result from the decomposition of certain machine coatings at relatively safe temperatures. In U.S. Pat. No. 3,573,460 to Skala, issued Apr. 6, 1971, a device is described which will detect the presence of sub-micron particles in the machine gas coolant. The patented device comprises an ionization section having a radioactive source applied thereto and a detector section having a voltage source applied thereto. The carrier gas is ionized and a current measurement is taken across the ionized gas flowing between two oppositely charged electrodes to detect the presence of submicron particles. The electrical conductivity of the ionized gas changes if submicron particles are present in the gas carrier and hence the detected current will decrease because of the collision of ions in the gas with any submicron particles, since these ions will attach themselves to the particles and will not contribute to the ion current. The device described in the Skala patent may be generally referred to as an ion chamber detector.

The foregoing has been applied in a monitoring apparatus for a gas cooled dynamoelectric machine as is described in U.S. Pat. No. 3,427,880 to Grobel et al, issued Feb. 18, 1969. An early warning of localized overheating within a dynamoelectric machine may be obtained by monitoring the gas coolant for submicron particles using an ion chamber detector.

Within the environment of a gas cooled dynamoelectric machine, oil mist particles may become entrained in the machine gas coolant being sampled by the ion chamber detector. It has been found that such oil mist particles may also cause a decrease in the ion chamber current thereby resulting in a signal output from the ion chamber detector which is largely indistinguishable from an output signal caused by pyrolysate particles. Since the intended function of the monitoring apparatus is to detect machine overheating, the oil mist signal then becomes a false signal which may cause station personnel to shut-down a machine prematurely or alternatively allow the machine to further overheat while awaiting a validation of the signal. This problem has been largely overcome by an invention described in U.S. Pat. application Ser. No. 719,838 filed Sept. 2, 1976 and incorporated herein by reference. In that Patent Application, a heated ion chamber detector has been devised which obviates the false signal which may be caused by oil mist particles. The ion chamber detector is heated to a temperature sufficient to gasify the oil mist particles while allowing the less volatile pyrolysate submicron particles caused by localized overheating to remain unaffected by the applied heat source.

BRIEF DESCRIPTION OF THE INVENTION

The present invention proposes the use of two ion chamber detectors in combination to provide a monitoring system which is partially redundant and which can differentiate between a detector output due to machine overheating and a detector output due to oil mist particles. Hence, provision is made for immediate validation of an overheating signal. A first ion chamber detector is at ambient temperature whereas a second ion chamber detector includes a means for heating the sample gas. If both detectors show a similar drop in the conductivity of the ionized gas sample, then an overheating signal is validated. If, on the other hand, the ambient detector shows a drop in conductivity and the heated detector does not show a similar drop, then the ambient detector output signal is invalidated and the presence of oil mist particles becomes suspected. In another aspect of the monitoring system, an oil mist generator is included for adding oil mist particles to the gas stream for testing the monitoring system.

OBJECTS OF THE INVENTION

It is one object of the invention to provide a monitoring system for a gas cooled dynamoelectric machine which can detect and validate the presence of pyrolysates in the machine gas coolant.

It is another object of the invention to provide a more reliable monitoring system, including redundant detector apparatus for a gas cooled dynamoelectric machine.

A further object of the invention is to provide a monitoring system for a gas cooled dynamoelectric machine according to the foregoing which is testable on line.

Other objects, advantages and features of the present invention will become apparent from the following description of a preferred embodiment thereof when read in connection with the accompanying drawings.

DETAILED DESCRIPTION OF THE INVENTION

Figure 1:
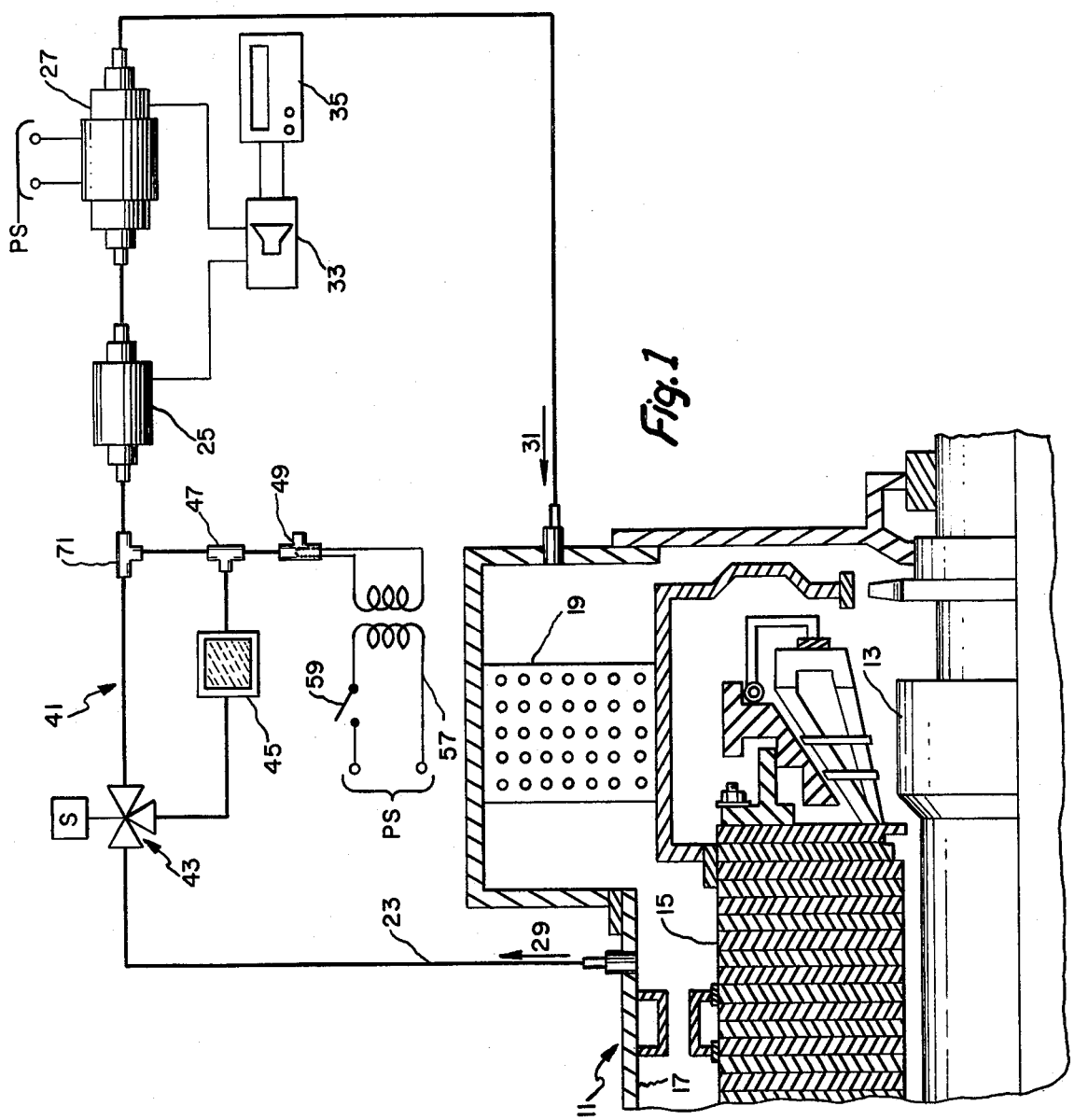
FIG. 1 is a schematic drawing of a monitoring system which is connectable to a gas dynamoelectric machine according to a preferred embodiment of the invention.

With reference to FIG. 1 of the drawings, a gas cooled dynamoelectric machine 11 includes a rotor 13 and a stator 15 within a gas tight outer casing 17 having suitable gas cooling means 19 within the outer casing. Appropriate electrical connections to the machine well known in the art and appropriate fluid connections to the gas cooling means also well known in the art have been omitted from the drawing for simplicity and because they are not directly relevant to the invention. It is also well known within the art that various machine parts may be coated with selected polymeric coatings and insulations which will decompose at elevated temperatures to give off submicron particles or particulates known as pyrolysates. The presence of these submicron particles in the machine gas coolant (normally hydrogen) is indicative of localized machine overheating or "hot spots". Evidence of these "hot spots" in the machine gas coolant will initiate at a very early stage and hence early detection of these pyrolysates will enable the machine operator to take appropriate action relative thereto prior to the occurrence of extensive damage to the machine.

Pursuant to this end, a conduit 23 is attached to the dynamoelectric machine for withdrawing a sample portion of the machine gas coolant from within the machine casing to a monitoring system according to the present invention. The conduit may be connected to the high pressure side of the cooling means 19 for withdrawing the sample gas which may then be recirculated to the low pressure side of the dynamoelectric machine to take advantage of the pumping action built into the dynamoelectric machine. Otherwise, the conduit may be connected to a suitable vent. Further, suitable inlet and outlet valves (not shown) may be incorporated into the conduit for isolating the monitoring system from the dynamoelectric machine.

The monitoring system includes, in combination, a first, ambient temperature ion chamber detector 25 and a second, heated ion chamber detector 27. The first, ambient temperature ion chamber detector 25 is of the type shown and described in U.S. Pat. No. 3,573,460 to Skala, issued Apr. 6, 1971; and U.S. Pat. No. 3,427,880 to Grobel et al, issued Feb. 18, 1969 both of which patents are incorporated herein by reference. The second, heated ion chamber detector 27 is of the type shown and described in U.S. patent application, Ser. No. 719,838 for a Heated Ion Chamber Detector filed Sept. 2, 1976 for Carson et al. and again incorporated herein by reference. As shown, the two detectors are connected in series and the heated ion chamber detector is downstream from the ambient temperature ion chamber relative to the direction of the gas flow through the conduit 23 indicated by directional arrows 29 and 31. Alternatively, the ion chamber detectors could be connected in parallel without departing from the scope of the present invention. A power supply (PS) is shown to be connected to the heated ion chamber detector for providing a resistance type heat source to the detector.

The detectors are each connected to an electrical amplifying device 33 which in turn drives indicators (not shown) on a recorder chart 35. The recorder may be any commercially available recorder which accepts two separate inputs and plots those inputs separately on a time chart for comparison. An example of such a recorder is a two-pen recorder, Model No. L11025 from Esterline Corporation of Indianapolis, Indiana. Hence, the output signal from each of the two ion chamber detectors is separately recorded for comparison of the respective output signals. The recorder provides one means for comparing the output signal of the ambient detector with the output signal of the heated detector. Alternatively, digital circuitry could be derived for comparing the respective output signals without departing from the scope of the present invention.

As has been earlier stated, occasionally oil mist particles are generated within the dynamoelectric machine which thereafter become entrained within the gas coolant. One way that oil can enter a dynamoelectric machine and contaminate the gas coolant is by a malfunctioning of the seal oil system. When a fine oil mist is present in sufficient quantity it can, under certain operating conditions, cause the ambient ion chamber detector reading to decrease in a manner similar to the occurrence of pyrolysates due to localized overheating. Thus in the arrangement shown, or in a parallel arrangement, the presence of oil mist particles in the conduit 23 would cause a decrease in the output of the ambient ion chamber detector while the heated ion chamber would read normal. This is because the heated ion chamber gasifies the oil mist particles in the ionization section upstream from the detector section as shown in U.S. patent application Ser. No. 719,838 and mentioned previously. On the other hand, if there are pyrolysates in the sample gas stream, the output signals of both the ambient detector and the heated detector will decrease, thereby giving immediate validation of a signal output due to pyrolysates. If there are both pyrolysates and oil mist particles in the gaseous carrier then both detectors will have a decreased output but the ambient detector will show a greater decrease than the heated detector.

In another aspect of the present invention, a test circuit 41 is provided in combination with the monitoring system. The test circuit comprises a three way valve 43 which may be operable by a remotely controlled solenoid S arranged to divert the conduit flow into the test circuit. The test circuit may also include a filter 45 to provide a clean "signal-free" gas for test purposes. Diversion of the sample gas through the filter is necessary for the test, because it may be desirable to check the performance of the heated detector while there is a signal on the ambient detector and perhaps the heated detector as well. The filter may be a mechanical filter of type described in U.S. Pat. No. 3,702,561 to Carson et al, issued Nov. 14, 1972. The diverted gas sample is then passed to a tee junction 47 which has one leg connected to an oil mist generator 49.

Figure 2:
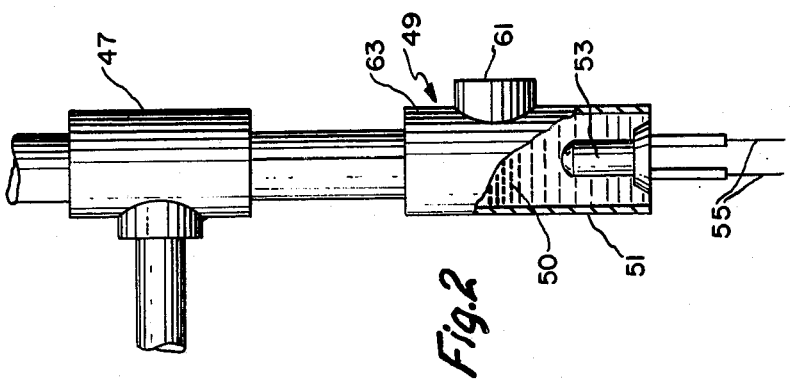
FIG. 2 is an enlarged partial cross-section drawing of an oil mist generator which may be employed within the monitoring system shown in FIG. 1.

Referring to FIG. 2, in combination with FIG. 1, the oil mist generator 49 comprises a tee section which also provides an oil reservoir for oil supply 50. One leg 51 of the tee section is fitted with a resistance heating element 53 having electrical leads 55 connected to an electrical circuit 57 including switch 59. A second leg 61 of the oil mist generator provides a drain-supply plug whereas a third leg 63 is connected to tee junction 47. Upon closure of switch 59, the resistance element heats the oil supply in the oil mist generator to produce oil mist particles into tee 47 and consequently into sample machine gas coolant. The diverted sample gas is then directed toward the detectors downstream through a tee 71.

In providing a test operation, the oil mist generator will provide oil mist contamination to the diverted gas sufficient to cause the ambient detector signal to decrease while the heated detector signal is unaffected. This procedure tests the operation of the ambient detector. At some preselected adjustable point, the heated detector may also be tested if the oil mist concentration in the sample gas is such that it exceeds the capability of the heated detector to vaporize the oil mist particles. Hence, both detectors are testable on line by means of the oil mist generator.

Under normal operating circumstances, the two detectors in series or parallel configuration each receive at least a portion of the gas sample. Each detector provides an output signal proportional to the current flow across the ionized gas. These output signals are amplified and then each output signal is input into the recorder 35. A first output signal from the ambient detector will drive a first pen on the recorder chart (not shown) whereas a second output signal from the heated detector will drive a second pen (not shown) whereby the second output will validate the first output if pyrolysates are present but will invalidate the first output if the cause of the first output signal is oil mist.

While there is shown what is considered, at present, to be the preferred embodiment of the invention; it is, of course, understood that various other modifications may be made therein, and it is intended to claim all such modifications as fall within the true spirit and scope of the present invention.

What is claimed is:

1. A monitoring system for a gas cooled dynamoelectric machine of the type having parts therein coated with selected materials which will decompose into submicron pyrolysate particles at elevated temperatures to become entrained in the machine gas coolant; the monitoring system connectable to the dynamoelectric machine for withdrawing a sample of the machine gas coolant and comprising:
    a first detector apparatus consisting of an ion chamber detector at ambient temperature receiving at least a portion of said machine gas sample and providing a first output signal based upon the conductivity of the ionized gas sample;
    a second detector apparatus consisting of a heated ion chamber detector receiving at least a portion of said machine gas sample and providing a second output signal based upon the conductivity of the ionized gas sample; and,
    means receiving said first and second output signals, said receiving means enabling a comparison between said first and second output signals whereby the presence of pyrolysate particles may be validated.

2. The system recited in claim 1 wherein the first detector apparatus and the second detector apparatus are connected in series; and, said first detector apparatus is upstream from said second detector apparatus relative to direction of the sample gas flow.

3. The system recited in claim 1 wherein the receiving means comprises a recorder which plots said first and second output signals against time.

4. The system recited in claim 1 further comprising a test circuit for selectively introducing oil mist particles into said sample gas comprising:
    a valve for diverting said sample gas through a filter;
    an oil mist generator downstream from said filter for introducing oil mist particles into said sample gas; and,
    means connecting test circuit to said first and second detector apparatus.

5. The system recited in claim 4 wherein the oil mist generator comprises:
    a reservoir for holding an oil supply; and,
    a heating element disposed in said reservoir for generating oil mist particles.

6. A monitoring system for a gas cooled dynamoelectric machine of the type having parts thereof coated with selected materials which will decompose into submicron pyrolysate particles at elevated temperatures to become entrained in the machine gas coolant; the monitoring system connectable to the dynamoelectric machine for withdrawing a sample of the machine gas coolant and comprising:
    a first detector apparatus consisting of an ion chamber detector at ambient temperature receiving at least a portion of said machine gas sample and providing a first output signal;
    a second detector apparatus consisting of an ion chamber detector at elevated temperature receiving at least a portion of said machine gas sample and providing a second output signal; and,
    means for recording said first and second output signals whereby the second signal will validate the first signal when like signals appear; and, said second signal will invalidate the first signal when dissimilar signals appear.

* * * * *